United States Patent
Kang

(10) Patent No.: US 7,471,097 B2
(45) Date of Patent: Dec. 30, 2008

(54) TEST PROBE WITH PLANAR GROUND TIP EXTENDING TRANSVERSELY FROM THE GROUND BARREL FOR A SEMICONDUCTOR PACKAGE

(75) Inventor: Sun-Won Kang, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/677,017

(22) Filed: Feb. 20, 2007

(65) Prior Publication Data

US 2007/0139062 A1    Jun. 21, 2007

Related U.S. Application Data

(62) Division of application No. 11/146,981, filed on Jun. 6, 2005, now Pat. No. 7,196,532.

(30) Foreign Application Priority Data

Jun. 22, 2004  (KR) .............................. 2004-46585

(51) Int. Cl.
*G01R 31/02* (2006.01)
(52) U.S. Cl. ...................... 324/761; 324/754
(58) Field of Classification Search .................. None
See application file for complete search history.

(56) References Cited

U.S. PATENT DOCUMENTS

| | | |
|---|---|---|
| 4,116,523 A | 9/1978 | Coberly et al. |
| 4,138,643 A | 2/1979 | Beck et al. |
| 4,603,023 A | 7/1986 | Mack et al. |
| 4,795,352 A | 1/1989 | Capp et al. |
| 5,004,977 A | 4/1991 | Kazama |
| 5,006,793 A | 4/1991 | Gleason et al. |
| 5,045,780 A | 9/1991 | Swart |
| 5,159,265 A | 10/1992 | Alfonso et al. |
| 5,291,129 A | 3/1994 | Kazama |
| 5,308,250 A | 5/1994 | Walz |
| 5,408,188 A | 4/1995 | Katoh |

(Continued)

FOREIGN PATENT DOCUMENTS

JP          6-138144          5/1994

(Continued)

OTHER PUBLICATIONS

English language abstract of Japanese Publication No. 6-138144, 1994.

(Continued)

*Primary Examiner*—Paresh Patel
(74) *Attorney, Agent, or Firm*—Marger Johnson & McCollom, P.C.

(57) ABSTRACT

An embodiment may comprise a test probe to measure electrical properties of a semiconductor package having ball-shaped terminals. The probe may include a signal tip and a ground tip. The signal tip may have a spherical lower surface allowing good contact with a ball-shaped signal terminal. The ground tip may be extended from a lower end of a ground barrel that encloses the signal tip. The ground tip may move independent of the signal tip by means of a barrel stopper and a spring. Thus, the probe can be used regardless of the size of and the distance between the package terminals.

10 Claims, 8 Drawing Sheets

U.S. PATENT DOCUMENTS

| | | |
|---|---|---|
| 5,491,427 A | 2/1996 | Ueno et al. |
| 5,506,515 A | 4/1996 | Godshalk et al. |
| 5,639,247 A | 6/1997 | Johnson et al. |
| 5,645,433 A | 7/1997 | Johnson |
| 5,731,710 A | 3/1998 | Mizuno et al. |
| 5,744,977 A | 4/1998 | Cuautla |
| 5,804,984 A | 9/1998 | Alcoe et al. |
| 5,867,019 A | 2/1999 | Malenko et al. |
| 5,945,838 A | 8/1999 | Gallagher et al. |
| 5,982,182 A * | 11/1999 | Chiu et al. .................. 324/754 |
| 5,990,697 A * | 11/1999 | Kazama ..................... 324/761 |
| 6,034,532 A | 3/2000 | Tarzwell |
| 6,051,982 A | 4/2000 | Alcoe et al. |
| 6,053,777 A | 4/2000 | Boyle |
| 6,194,908 B1 | 2/2001 | Wheel et al. |
| 6,204,681 B1 | 3/2001 | Nagatsuka et al. |
| 6,242,930 B1 | 6/2001 | Matsunaga et al. |
| 6,275,054 B1 | 8/2001 | Boyle |
| 6,327,777 B1 | 12/2001 | Ide et al. |
| 6,447,328 B1 | 9/2002 | Feldman |
| 6,497,581 B2 | 12/2002 | Slocum et al. |
| 6,498,506 B1 | 12/2002 | Beckous |
| 6,551,126 B1 | 4/2003 | Feldman |
| 6,758,680 B2 | 7/2004 | Duquerroy et al. |
| 6,834,380 B2 | 12/2004 | Khazei |
| 6,891,360 B1 | 5/2005 | Beaman et al. |
| 7,015,702 B2 * | 3/2006 | Rupp ........................ 324/607 |
| 2002/0053463 A1 | 5/2002 | Slocum |
| 2003/0062914 A1 | 4/2003 | Iorga |
| 2004/0012402 A1 | 1/2004 | Sinclair |
| 2004/0239356 A1 | 12/2004 | Kazama |
| 2005/0007128 A1 | 1/2005 | Beckous et al. |
| 2005/0280432 A1 | 12/2005 | Kang |

FOREIGN PATENT DOCUMENTS

| | | |
|---|---|---|
| JP | 2000-97969 | 4/2000 |
| JP | 2001-21615 | 1/2001 |
| JP | 2004-53343 | 2/2004 |
| KR | 2001-0046510 | 6/2001 |

OTHER PUBLICATIONS

English language abstract of Japanese Publication No. 2000-97969, 2000.

English language abstract of Japanese Publication No. 2001-21615, 2001.

English language abstract of Korean Publication No. 2001-0046510, 2001.

English language abstract of Japanese Publication No. 2004-53343, 2004.

* cited by examiner

TEST PROBE WITH PLANAR GROUND TIP EXTENDING TRANSVERSELY FROM THE GROUND BARREL FOR A SEMICONDUCTOR PACKAGE

CROSS REFERENCE TO RELATED APPLICATIONS

This is a Divisional application of U.S. patent application Ser. No. 11/146,981, filed on Jun. 6, 2005, now issued as U.S. Pat. No. 7,196,532, which claims priority under 35 U.S.C. §119 from Korean Patent Application No. 2004-46585, which was filed in the Korean Intellectual Property Office on Jun. 22, 2004, the contents of which are incorporated by reference herein in their entirety.

BACKGROUND

Embodiments of the present invention may relate to a test probe for a semiconductor package and, also to a test probe that may test electrical properties of a semiconductor package having ball-shaped input/output terminals.

Semiconductor devices are electronics that are typically packaged in semiconductor packages. The semiconductor package not only protects the semiconductor device from environmental conditions, but also provides interconnects for the semiconductor device to communicate with external hardware. Since a semiconductor device communicates through semiconductor package interconnects, the electrical properties of the semiconductor package greatly influence the operation of the semiconductor device. This influence is especially true for high-speed devices. Therefore, determination of semiconductor package electrical properties is relevant to managing semiconductor device performance. Ideally, a semiconductor package does not alter signal or power levels for a semiconductor device. In practice, the package may distort or lose signals or power for the device. This distortion and loss may be caused by various characteristics of the package, such as structure of transmitting lines, package element characteristics, etc. The factors that cause the distortion and loss are often referred to as parasitic parameters. Parasitic parameters may be represented by various quantitative models. Example models include an RLC circuit model, a frequency response model, and an impedance profile model.

Conventionally, probes with needle-shaped tips have been used to determine electrical properties and consequent parasitic parameters. A needle-shaped probe tip may touch terminals of a package, for example package pins, and form an electrical connection between the probe and package. Typical probes are GS and GSG probes, ground signal tips and ground signal ground tips, respectively, and the tips are generally arranged at fixed distances from each other. Package terminals spacing may vary considerably from package to package, and may not easily be measured by probes with fixed distances between measurement tips.

Currently, ball grid array (BGA) packages are widely used. A BGA package has an array of solder balls as input/output terminals, which is distributed over a package surface. The surface-distributed terminals reduce electrical signal propagation paths within the package and improve electrical and thermal properties. However, ball-shaped terminals may lose a good contact with the needle-shaped probe tips. Therefore, a conventional probe may often incorrectly measure the electrical properties of the package.

SUMMARY

An embodiment may comprise a test probe for a semiconductor package comprising a first tip having a concave lower surface and configured to meet a first terminal, and a second tip adjacent to the first tip, the second tip configured to meet a second terminal. The present embodiment may further comprise the concave lower surface being configured to meet a ball shaped signal terminal and the ground tip is configured to meet a ball shaped ground terminal. Additionally, the present embodiment may further comprise the concave lower surface being spherical.

DETAILED DESCRIPTION

Figure 1:
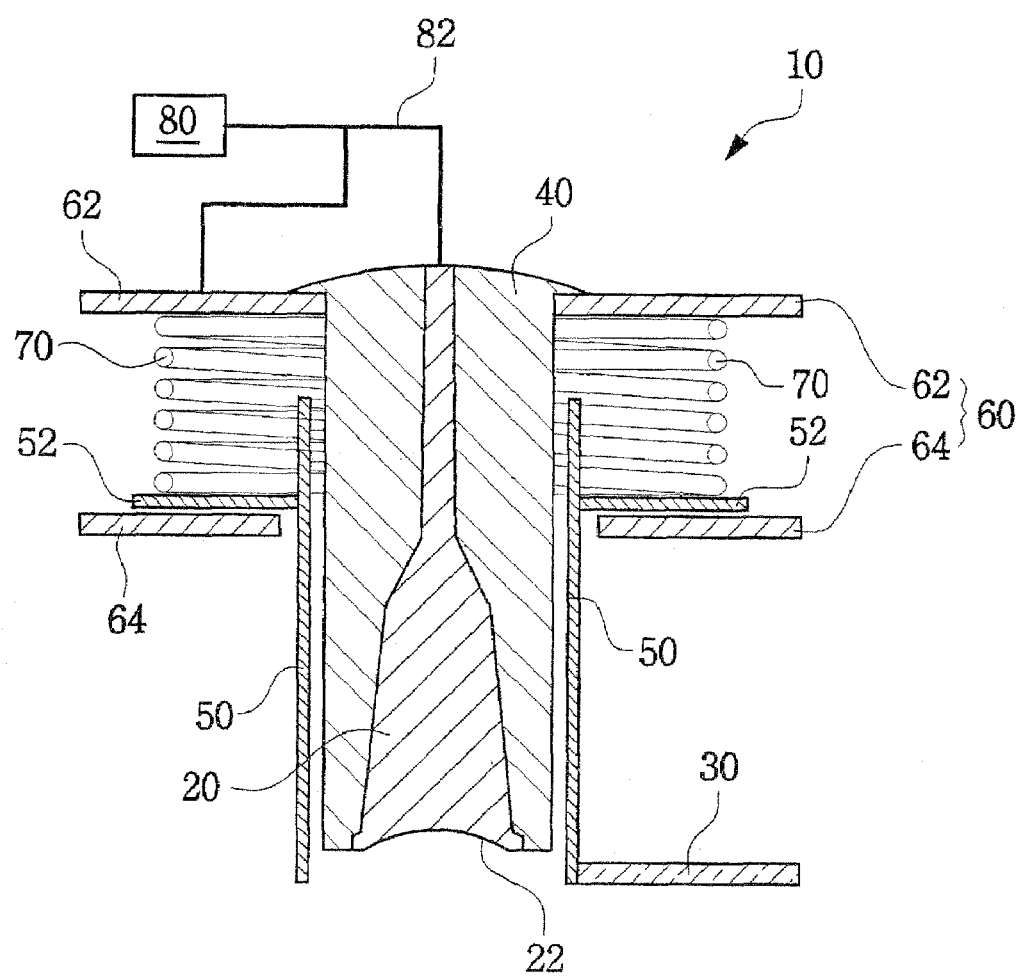
FIG. 1 is a cross-sectional view of a test probe in accordance with an exemplary embodiment of the present invention.

Exemplary, non-limiting embodiments of the present invention will now be described with reference to the accompanying drawings. This invention may, however, be embodied in many different forms and should not be construed as limited to the disclosed embodiments. Rather, the disclosed embodiments are provided so that this disclosure will be thorough and complete, and the claims will convey the scope of the invention to those skilled in the art, In this disclosure, well-known structures and processes are not described or illustrated in detail to avoid obscuring the present disclosure. Furthermore, the figures are not drawn to scale in the drawings. Rather, for simplicity and clarity of illustration, the dimensions of some of the elements are exaggerated relative to other elements. Like reference numerals are used for like and corresponding parts of the various drawings.

EXEMPLARY EMBODIMENTS

FIG. 1 is a cross-sectional view of a test probe 10 in accordance with an exemplary embodiment. The probe 10 may include a signal tip 20 and a ground tip 30. The signal tip 20 may have concave lower surface, for example spherical lower surface 22, and may be enclosed with an insulating body such as cylindrical insulating body 40. Ground tip 30, adjacent to signal tip 20, may extend from a lower end of a ground barrel 50. In the embodiment illustrated in FIG. 1, the ground tip 30 extends horizontally from the ground barrel 50. In an embodiment, the ground tip 30 may have a planar surface, and the ground barrel 50 may have a cylindrical form with a partially vacant inside and open ends. In an embodiment, the signal tip 20 and the insulating body 40 may be located inside the ground barrel 50, forming a coaxial structure. Insulating body 40 may electrically isolate signal tip 20 from the ground barrel 50.

The probe 10 may include a probe head 60. In an embodiment, the probe head 60 may have a top head 62 and a bottom head 64 which may be spaced apart from each other. In the present embodiment, the insulating body 40 may penetrate the top and bottom heads 62 and 64 and then protrude downward from the bottom head 64. The insulating body 40 may be fixedly joined to the top head 62. The ground barrel 50 may penetrate the bottom head 64 and then protrude downward from the bottom head 64. Ground barrel 50 may have a barrel stopper 52 that horizontally extends from the ground barrel 50 and may be between the top and bottom heads 62 and 64. A spring 70 may be provided between the top head 62 and the barrel stopper 52.

In the present embodiment, the ground barrel 50 may be pushed downward by the spring 70 until the barrel stopper 52 meets the bottom head 64. When the barrel stopper 52 meets the bottom head 64, the ground tip 30 located at the lower end of the ground barrel 50 is located below the lower surface 22 of the signal tip 30. In the present embodiment, the upper end of the ground barrel 50 may be separated from the top head 62 to allow movement of the ground barrel 50. So, the ground barrel 50 can be pushed toward top head 62, and therefore compress spring 70.

In the present embodiment, the signal tip 20 may be fixed to the probe head 60 through the insulating body 40, yet still allow the ground tip 30 to move through the ground barrel 50 independent of the signal tip 20.

In one embodiment, a measuring unit 80 may measure electrical properties of a package and may electrically couple to signal tip 20 through a connection cable 82. In the present embodiment, the top head 62 may be coupled to a ground line of connection cable 82. In an embodiment, the ground barrel 50 may electrically couple to the ground line through the spring 70 between the top head 62 and the barrel stopper 52.

Figure 2A:
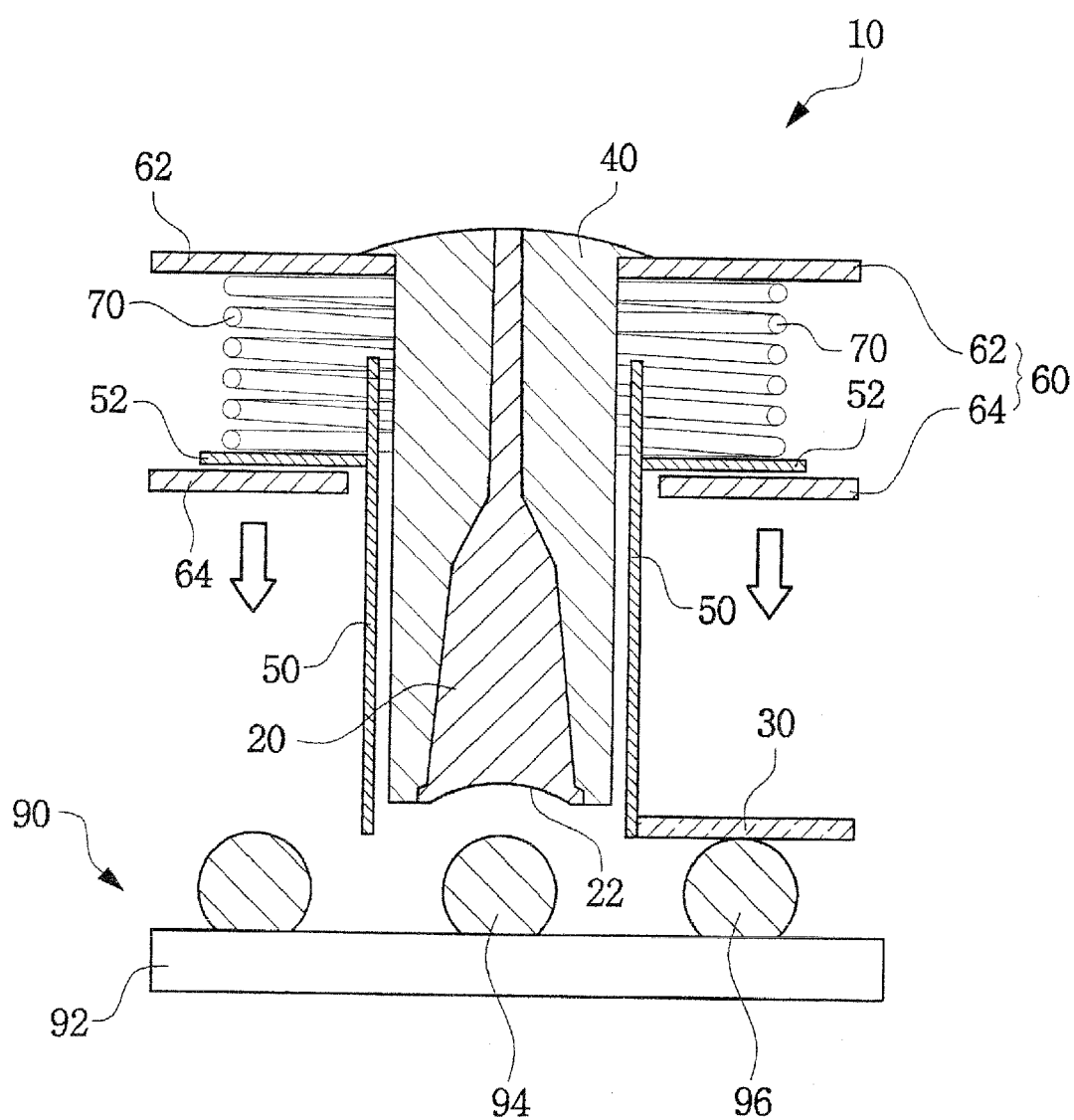
FIGS. 2A and 2B are cross-sectional views showing two working states of the test probe shown in FIG. 1.
Figure 2B:
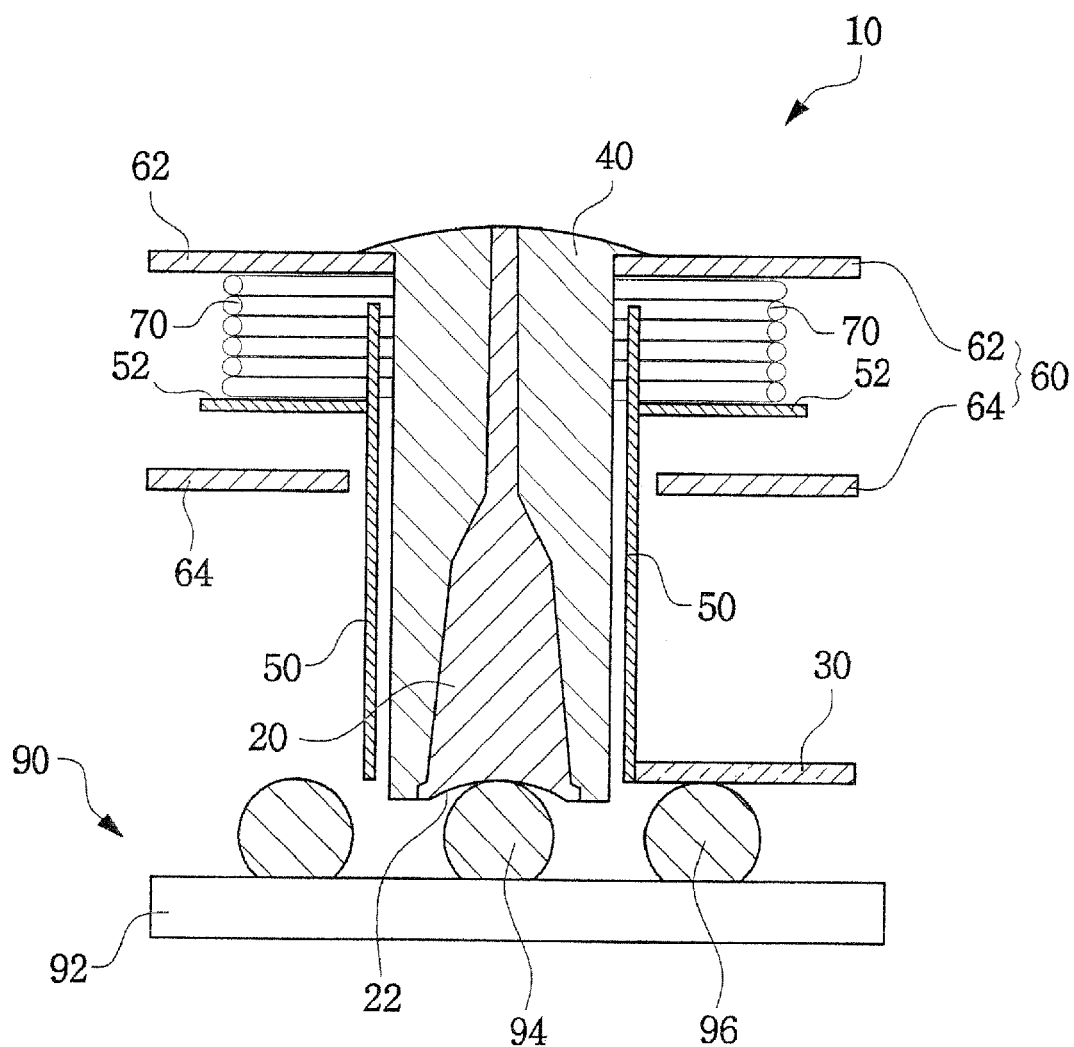

Referring to FIGS. 2A and 2B, an embodiment probe 10 is illustrated in two working states. In FIG. 2A the probe 10 is shown in an initial position. A semiconductor package 90, in this example a BGA package, may have an array of terminals, such as solder balls, including a signal ball 94 and a ground ball 96. In an embodiment, the terminals may be distributed over a surface of a package substrate 92. Package 90 may comprise other well known elements that are not necessary to understand the present description, therefore their illustration and description is omitted. An embodiment may comprise a method of placing a concave tip of a semiconductor package test probe to a signal terminal of the semiconductor package, and placing a second tip of the test probe to a ground terminal of the semiconductor package.

In an embodiment, the probe 10 may connect to a probe arm (not shown) that can move freely in all directions. This probe arm allows the probe 10 to move to a signal ball 94 to be measured. The signal tip 20 may be positioned above the signal ball 94 so the probe head 60 can move toward the semiconductor package 90, in particular, probe head 60 can move toward signal ball 94. In the present embodiment, ground tip 30 may touch ground ball 96 before the signal tip 20 reaches signal ball 94 since ground tip 30 is below the signal tip 20.

In the present embodiment, the probe head 60 may descend while the ground ball 96 stops the ground tip 30 from descending, as shown in FIG. 2B. At a certain point, the ground barrel 50 will not be allowed to move as the spring 70 may be fully compressed. At this time, the signal tip 20 may be exposed from the ground barrel 50. In this embodiment, the lower surface 22 of the signal tip 20 may then contact signal ball 94. In the present embodiment, the lower surface 22 of the signal tip 20 has a concave shape approximating that of a sphere, therefore allowing a good contact between the signal tip 20 and the signal ball 94.

Probe 10 can be used regardless of package terminal size and spacing. That is, the probe may be configured to contact terminals with different distances between them. Additionally, even if the probe 10 is incorrectly aligned with the package terminals 94 and 96, it is possible to keep a contact between the probe 10 and the terminals 94 and 96. FIGS. 3A to 3E illustrate various example applications for embodiment probe 10.

Figure 3A:
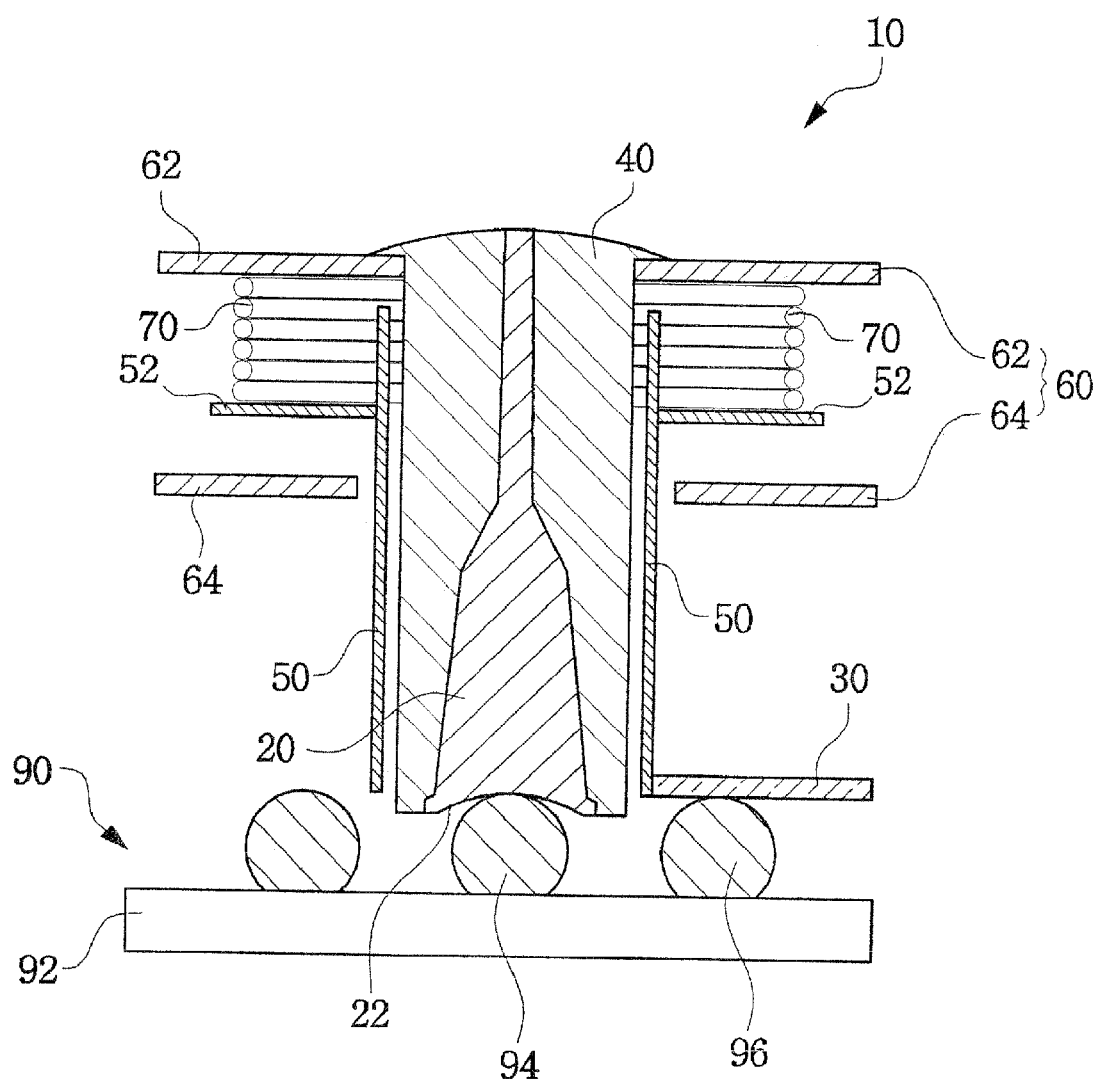
FIGS. 3A to 3E are cross-sectional views showing various cases in which the test probe shown in FIG. 1 can be applied.
Figure 3B:
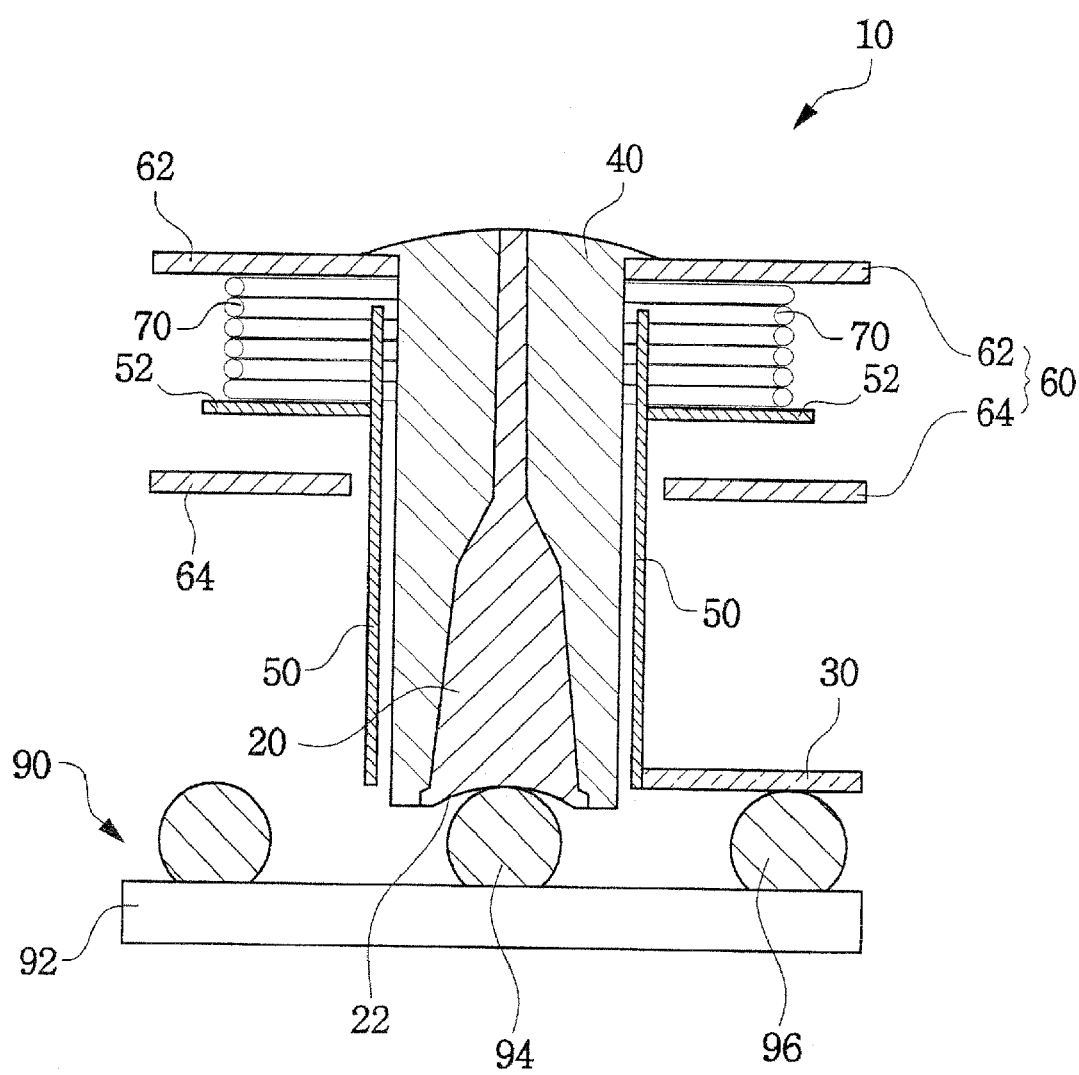
Figure 3C:
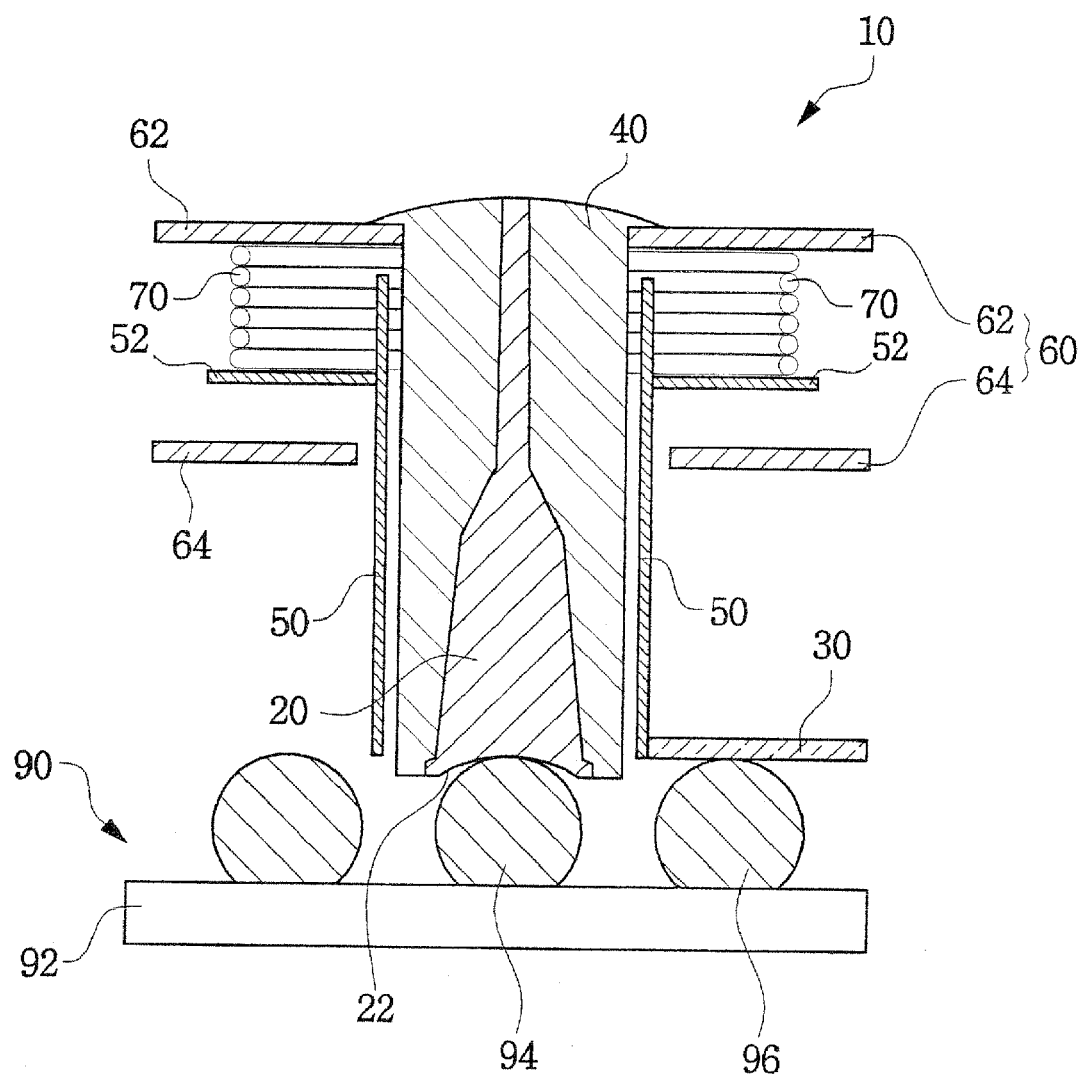

Referring to FIG. 3A, probe 10 may be applied to a BGA package 90. In comparison with FIG. 3A, the package 90 in FIG. 3B has package terminals 94 and 96 spaced farther apart, and package 90 in FIG. 3C has taller package terminals 94 and 96. As seen from these examples, probe 10 may be used with various packages having different package terminal geometries.

Figure 3D:
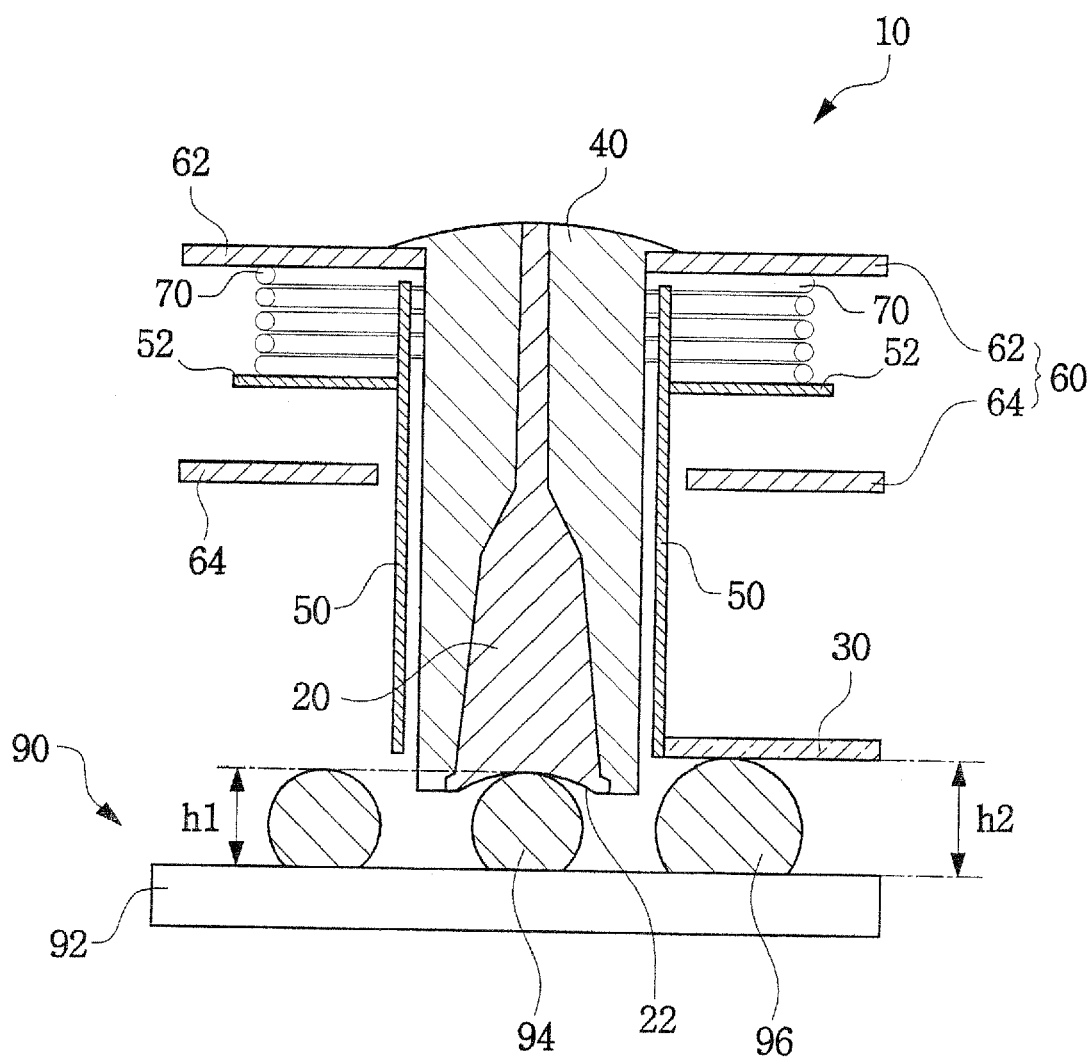

Furthermore, FIG. 3D illustrates package terminals 94 and 96 with different heights h1 and h2. Package terminals may be formed with different heights due to variations in process conditions, etc. In the present example, probe 10 can perform a reliable measurement since the signal tip 20 and the ground tip 30 may operate independently.

Figure 3E:
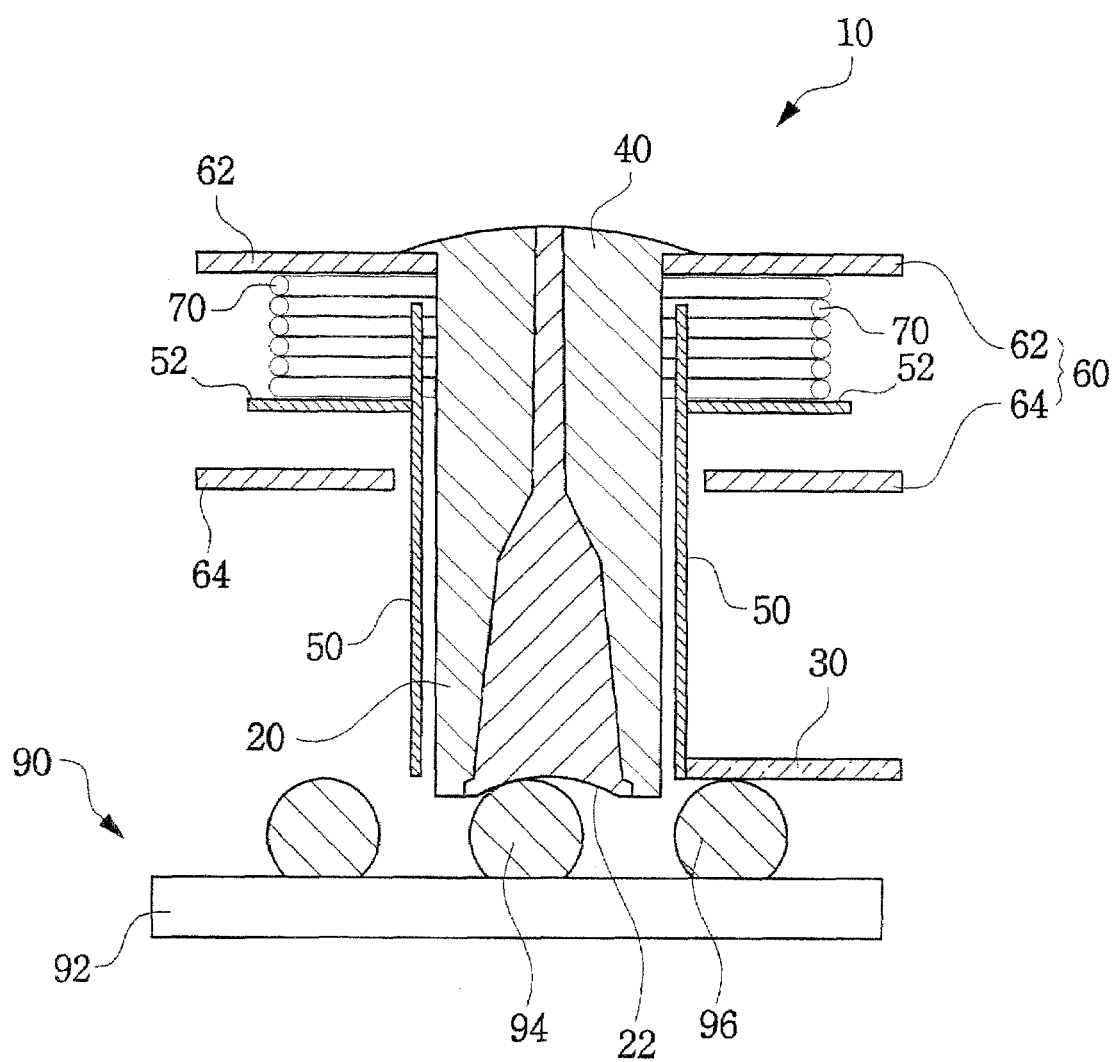

In yet another example, FIG. 3E illustrates a probe 10 incorrectly aligned with package terminals 94 and 96. In this case, a signal tip 20 with a lower surface 22 can still perform an effective measurement.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A test probe for a semiconductor package comprising:
a ground barrel;
a signal tip located within the ground barrel, the signal tip having a lower surface and configured to meet a signal terminal; and
a planar ground tip extending transversely from the ground barrel, the planar ground tip including a planar testing surface configured to meet ground terminals that are at varying distances from the signal tip, wherein the planar testing surface is substantially coplanar with a bottom surface of the ground barrel.

2. The test probe of claim 1, wherein the lower surface of the signal tip has a spherical shape.

3. The test probe of claim 1, wherein the ground barrel is cylindrical and the ground tip transversely extends from a lower end of the ground barrel.

4. The test probe of claim 1, further comprising an insulating body enclosing the signal tip and located inside the ground barrel, the insulating body to electrically isolate the signal tip from the ground barrel.

5. The test probe of claim 4, further comprising a probe head having a top head and a bottom head spaced apart from each other;
a barrel stopper extended from the ground barrel and placed between the top and bottom heads; and
a spring between the top head and the barrel stopper.

6. The test probe of claim 5, wherein the insulating body penetrates the top and bottom heads and wherein the insulating body is fixed to the top head and protrudes beyond the bottom head.

7. The test probe of claim 5, wherein the ground barrel penetrates the bottom head and protrudes beyond the bottom head.

8. A test probe for a semiconductor package comprising:
a ground barrel;

a signal tip located within the ground barrel, the signal tip having a lower surface and configured to meet a signal terminal;

a planar ground tip extending from the ground barrel, the planar ground tip configured to meet a ground terminal;

a probe head having a top head and a bottom head spaced apart from each other;

a barrel stopper extended from the ground barrel and placed between the top and bottom heads; and a spring between the top head and the barrel stopper, wherein the ground barrel penetrates the bottom head and protrudes beyond the bottom head.

9. The test probe of claim 8, further comprising an insulating body enclosing the signal tip and located inside the ground barrel, wherein the insulating body electrically isolates the signal tip from the ground barrel and wherein the insulating body is moveable relative to the bottom head.

10. The test probe of claim 8, wherein the planar ground tip extends transversely from the ground barrel.

* * * * *